(12) United States Patent
Yamamoto et al.

(10) Patent No.: US 6,205,165 B1
(45) Date of Patent: Mar. 20, 2001

(54) GAIN-COUPLING TYPE DISTRIBUTED FEEDBACK SEMICONDUCTOR LASER AND METHOD FOR PRODUCING THE SAME

(75) Inventors: Kei Yamamoto, Tenri; Hidenori Kawanishi, Nara, both of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/272,944

(22) Filed: Mar. 18, 1999

(30) Foreign Application Priority Data

Mar. 19, 1998 (JP) .................................. 10-070268
Mar. 16, 1999 (JP) .................................. 11-071057

(51) Int. Cl.⁷ .............................. H01S 3/08; H01L 21/20
(52) U.S. Cl. .............................. 372/96; 372/43; 372/50; 372/101; 372/102; 437/129
(58) Field of Search .................................. 372/43, 44, 50, 372/92, 96, 101, 102; 437/129

(56) References Cited

U.S. PATENT DOCUMENTS

| | | | |
|---|---|---|---|
| 5,093,835 | * | 3/1992 | Takemoto et al. ...................... 372/45 |
| 5,143,864 | * | 9/1992 | Takemoto et al. .................... 437/129 |
| 5,276,702 | * | 1/1994 | Meliga ................................... 372/96 |
| 5,347,533 | * | 9/1994 | Higashi et al. ......................... 372/96 |
| 5,703,899 | * | 12/1997 | Mizutani ................................ 372/96 |
| 5,727,013 | * | 3/1998 | Botez et al. ............................ 372/96 |
| 5,732,102 | * | 3/1998 | Bouadma ................................ 372/96 |
| 5,764,682 | * | 6/1998 | Ishino et al. ........................... 372/96 |
| 5,943,554 | * | 8/1999 | Dautremont-Smith ................. 438/32 |
| 5,960,257 | * | 9/1999 | Ishino et al. ....................... 372/96 X |
| 5,966,399 | * | 10/1999 | Jiang et al. ............................ 372/96 |
| 5,970,081 | * | 10/1999 | Hirayama et al. ..................... 372/96 |
| 6,108,362 | * | 8/2000 | Adams et al. .......................... 372/50 |

FOREIGN PATENT DOCUMENTS

| | | | |
|---|---|---|---|
| 05183236 | 7/1993 | (JP) | .................................. 372/96 X |
| 06097571 | 4/1994 | (JP) | .................................. 372/96 X |
| 07045907 | 2/1995 | (JP) | .................................. 372/96 X |
| 2713445 | 10/1997 | (JP) | .................................. 372/96 X |

OTHER PUBLICATIONS

Biasiol et al. (1997) "Low–pressure OMCVD growth of AlLaAs vertical quantum wells on non–planar substrates" *J. of Crystal Growth* 170, 600–604.

Pan et al. (1995) "The in Situ Growth of Lateral Confinement Enhanced Rectangular ALGaAs/A1As Quantum Wires by Utilizing the Spontaneous Vertical Quantum Wells" Extended Abstracts of the 1995 International Conference on Solid State Devices and Materials, Osaka 737–739.

Pan et al. (1996) "Growth temperature dependence of A1GaAs spontaneous vertical quantum wells on V–grooved substrates by low–pressure metalorganic vapor phase epitaxy" *J. of Crystal Growth* 158, 205–209.

Pan et al., (Feb. 1996) "Rectangular AlGaAs/A1As Quantum Wires Using Spontaneous Vertical Quantum Wells" *Jpn. Appl. Phys.* 35, Part 1, No. 2B, 1214–1216.

Usami et al. (Jun. 3, 1996) "Time–resolved photoluminescence study on $Al_xGa_{1-x}As$ spontaneous vertical quantum well structures" *Appl. Phys. Lett.* 68 (23): 3221–3223.

Vermeire et al. (1992) "Anisotropic photoluminescence behaviour of vertical AlGaAs structures grown on gratings" *J. of Crystal Growth* 124, 513–518.

* cited by examiner

*Primary Examiner*—Brian Healy
(74) *Attorney, Agent, or Firm*—Morrison & Foerster LLP

(57) ABSTRACT

A gain-coupling type distributed feedback semiconductor laser device having a periodically varying gain along a cavity direction includes: a first periodic undulation formed along the cavity direction, the first periodic undulation including convex and concave portions; a semiconductor embedded layer formed on the first periodic undulation; and at least one active layer formed within the semiconductor embedded layer so as to extend along a direction which is perpendicular to the surface of a substrate, the at least one active layer being present on the concave portions of the first periodic undulation with a period which is substantially equal to a period of the first periodic undulation.

15 Claims, 4 Drawing Sheets

Gain distribution

Gain distribution

PRIOR ART

GAIN-COUPLING TYPE DISTRIBUTED FEEDBACK SEMICONDUCTOR LASER AND METHOD FOR PRODUCING THE SAME

BACKGROUND OF THE INVENTION

1. Field of the Invention

The present invention relates to a gain-coupling type distributed feedback semiconductor laser device, and a method for producing the same.

2. Description of the Related Art

Distributed feedback (DFB) semiconductor laser devices are utilized as coherent light sources having variable or stabilized wavelengths and capable of operating in a mono-axial mode, and as such are increasingly in demand in the field of optical measurement, optical communications/transfer, optical recording, laser beam printers, and the like. In a DFB laser device, a diffraction grating is provided in an active layer or a guide layer for causing optical feedback so as to provide laser oscillation. DFB laser devices are generally classified into two categories: refractive index-coupling (IC) DFB laser devices, in which distributed feedback is attained by periodically varying the refractive index provided by a diffraction grating; and gain-coupling (GC) DFB laser devices, in which distributed feedback is attained by periodically varying the gain provided by a diffraction grating.

Due to their operation principles, IC-DFB laser devices are likely to laser oscillate in two modes because a stop band which exists in the vicinity of the Bragg wavelength is interposed between two symmetrically-positioned longitudinal modes having minimum threshold gains. On the other hand, GC-DFB laser devices have been theoretically confirmed to yield a single longitudinal mode with a probability of substantially 100%, irrespective of the end face phase.

GC-DFB laser devices can be further classified into two subcategories, with respect to the kind of structure that is employed to provide a periodically varying gain: a gain diffraction grating structure, in which the active layer provides a periodical varying gain; and an absorptive diffraction grating structure, which incorporate periodic regions for absorbing part of the induced emission that is generated from the active layer, thereby effectively providing a periodically varying gain.

Since the absorptive diffraction grating includes regions which are periodically located in the vicinity of the active layer for absorbing part of the induced emission generated from the active layer, a large absorption loss of energy may result, thereby increasing the oscillation threshold. However, the gain diffraction grating structure is free from the problem of increased oscillation thresholds because it does not incorporate any regions for absorbing a portion of the induced emission generated from the active layer.

Some conventional DFB laser devices incorporate a quantum well structure in their active layers. A quantum well structure features light-emitting layers which are composed of very thin well layers (e.g., several nanometers), with a view to enhancing the carrier density within the active layer and improving the laser characteristics of the device.

FIG. 8 is a cross-sectional view illustrating a conventional gain diffraction grating type GC-DFB laser device incorporating a quantum well layer structure as an active layer (taken along the direction of its laser cavity).

This conventional GC-DFB laser device is constructed as follows: First, an n-cladding layer 81 and an undoped quantum well layer 82 are formed on an n-substrate 80 by MOCVD (metal organic chemical vapor deposition). The undoped quantum well layer 82 includes well layers 82a and barrier layers 82b. Next, a diffraction grating is impressed on the uppermost layer among the growth layers by a two-beam interference exposition method and etching. Then, a further growth (regrowth) process is performed by MOCVD to form a p-cladding layer 83, and p-contact layer 84. Thereafter, electrodes 851 and 852 are deposited. Finally, the wafer is cleaved, whereby the semiconductor laser device is completed.

This conventional laser device provides a periodic gain distribution by directly etching the active layer, thereby realizing a GC-DFB laser device.

However, in accordance with the above conventional example, it is necessary to first perform a growth process up to the active layer, temporarily suspend the growth to allow the impression of a diffraction grating thereupon, and then resume the growth (regrowth) process to further form a cladding layer. Generally, during the period of suspended growth which proceeds a regrowth process, the substrate surface is exposed to the atmosphere and therefore degraded; as a result, the crystallinity of the material at the regrowth interface is greatly deteriorated. In the case of the above conventional example, in which a relatively large area within the active layer defines a regrowth interface, the crystallinity at the regrowth interface within the active layer undergoes severe deterioration. As a result, the semiconductor crystalline structure of the active layer suffers from defects.

Such crystal defects increase a recombination component which is unrelated to light emission, thereby greatly reducing the induced emission. This degrades the characteristics of the semiconductor laser and greatly reduces the reliability of the device.

SUMMARY OF THE INVENTION

A gain-coupling type distributed feedback semiconductor laser device having a periodically varying gain along a cavity direction according to the present invention includes: a first periodic undulation formed along the cavity direction, the first periodic undulation including convex and concave portions; a semiconductor embedded layer formed on the first periodic undulation; and at least one active layer formed within the semiconductor embedded layer so as to extend along a direction which is perpendicular to the surface of a substrate, the at least one active layer being present on the concave portions of the first periodic undulation with a period which is substantially equal to a period of the periodic undulation.

In one embodiment of the invention, the semiconductor embedded layer and the at least one active layer include a III–V group compound semiconductor containing at least one III group element and at least one V group element, the semiconductor embedded layer including the at least one III group element at a component ratio not equal to a component ratio at which the at least one active layer includes the at least one III group element.

In another embodiment of the invention, the at least one active layer includes a vertical quantum well structure.

In still another embodiment of the invention, the at least one active layer is formed of a quantum well wire structure, at least one layer of the quantum well wire structure being provided along a direction which is perpendicular to the surface of the substrate.

In still another embodiment of the invention, at least two periodic undulations including the first periodic undulation are provided, the at least two periodic undulations comprise convex and concave portions which are formed In a same period and positions as that of the first periodic undulation.

In still another embodiment of the invention, the at least two periodic undulations have substantially a same shape.

In still another embodiment of the invention, each of the concave portions of the periodic undulation includes a flat portion having a width along the cavity direction which is in the range of about 0 nm to about 30 nm.

In still another embodiment of the invention, each of the concave portions of the periodic undulation includes lateral surfaces formed of a (n11) plane and a bottom formed of the (100) plane.

In still another embodiment of the invention, each of the concave portions has a depth equal to or greater than about 40 nm.

In still another embodiment of the invention, the semiconductor embedded layer includes a III–V group compound semiconductor containing at least one III group element and at least one V group element, wherein the at least one III group element is selected from Al and Ga.

In still another embodiment of the invention, the semiconductor embedded layer includes Al at a component ratio in the range of about 0.1 to about 0.3.

In still another embodiment of the invention, at least one semiconductor layer is provided between the at least two periodic undulations, the semiconductor layer is formed of a compound semiconductor containing Al at a component ratio which is equal to or greater than about 0.45.

In still another embodiment of the invention, the at least one active layer has a height which is equal to or greater than about 60 nm.

A method for producing a gain-coupling type distributed feedback semiconductor laser device having a periodically varying gain along a cavity direction according to the present invention includes the steps of: forming a periodic undulation including convex and concave portions on a surface of a semiconductor; and forming a semiconductor embedded layer formed on the periodic undulation, the semiconductor embedded layer including periodically disposed active layers.

In one embodiment of the invention, the semiconductor embedded layer includes a III–V group compound semiconductor containing at least two III group elements having respective migration rates, and the step of forming the semiconductor embedded layer includes forming the active layers so that the active layers include one of the at least two III group elements at a component ratio not equal to a component ratio at which the semiconductor embedded layer includes the one of the at least two III group elements.

Thus, in accordance with the gain-coupling type distributed feedback semiconductor laser device of the present invention, differential migration of the materials used therein provides a crystal layer, grown upon an undulation including convex and concave portions, with regions whose component ratios vary with the period of the convex and concave portions of the undulation. Such regions define DH (double-hetero) structures, quantum well structures, or quantum well wire structures which function as periodic light emission regions extending along a direction perpendicular to the surface of the substrate. As a result, a periodically varying gain is provided.

When a III group material is grown on the (100) plane and the (111) plane of the underlying crystal, the III group tends to bind more readily to the (100) plane than the (111) plane, so that a portion of the material which is present on the (111) plane is likely to migrate onto the (100) plane, the migration behavior depending on the material. In the case of growing an AlGaAs layer, for example, Ga is more liable to migrate than Al. In the case of a substrate whose surface is formed of the (100) plane and which has an undulation including V-shaped convex and concave portions formed thereon, the slopes of each convex or concave portion may be the (111) plane. Therefore, migration occurs toward the bottom of each concave portion of the undulation. As a result, the concentration of Ga at the concave portions increases, resulting in differential component ratios of AlGaAs between the slopes and the bottom. Thus, vertical quantum well (VQW) structures are formed.

The concave and convex portions of the undulation will be gradually buried with the formation of higher-order planes (i.e., (nil) planes). As a result, the VQW structures are formed so as to very accurately correspond only to the bottoms of the concave portions.

In the case where a flat portion (i.e., the (100) plane) is created at the bottom of each concave portion, the Ga atoms which have migrated from the opposing slopes will spread over the flat portion. Such a flat portion should preferably be made as narrow as possible. The reason is that the Ga concentration at the concave portions will increase as the flat portion of the concavity becomes narrower, thereby providing greater differences in the component ratio of the semiconductor on the concave portion and the semiconductor on the convex portion, which in turn provides enhanced carrier confinement in the VQW structures and hence greater quantum well effects, a reduced threshold of the semiconductor laser device, and improved reliability.

Any commonly employed semiconductor layer growth method, including MOCVD, MBE, CBE, MOMBE, GSMBE, and the like, can be used as the growth method although MOCVD is the most preferable.

Thus, the invention described herein makes possible the advantage of providing a gain-coupling type DFB semiconductor laser with a high gain coupling coefficient, and a method for producing the same with a high yield.

This and other advantages of the present invention will become apparent to those skilled in the art upon reading and understanding the following detailed description with reference to the accompanying figures.

DESCRIPTION OF THE PREFERRED EMBODIMENTS

Example 1

Figure 1:
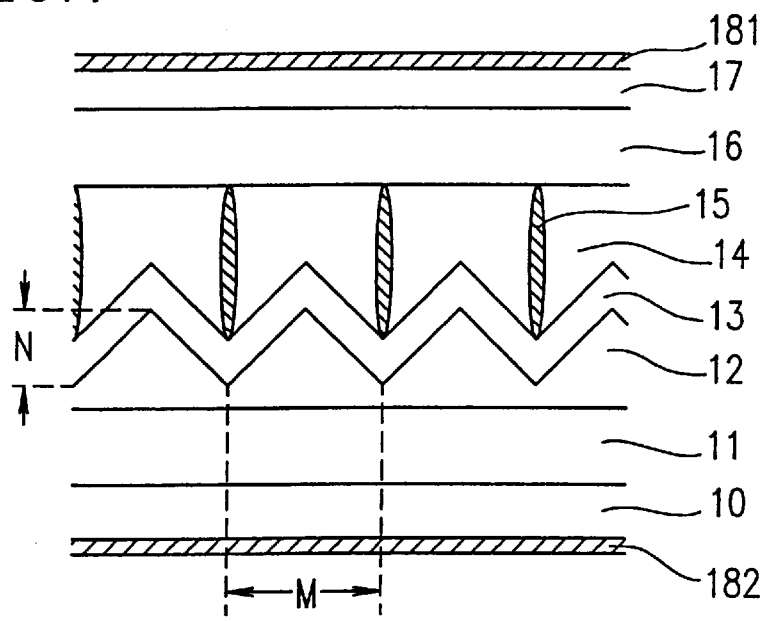
FIG. 1 is a cross-sectional view illustrating the structure of a GC-DFB semiconductor laser device according to Example 1 of the present invention.

FIG. 1 is a cross-sectional view illustrating the structure of a GC-DFB semiconductor laser device according to Example 1, taken along the direction of its laser cavity.

According to the present example, an n-$Al_{0.6}Ga_{0.4}As$ cladding layer 11 (thickness: about 1 μm) and an n-$Al_{0.6}Ga_{0.4}As$ guide layer 12 (thickness: about 0.1 μm) are formed on an n-GaAs substrate 10 by MOCVD. Next, a triangular-wave like undulation, including convex and concave portions, is impressed on the uppermost layer among the growth layers so as to have a period N of about 120 nm and a depth N of about 70 nm, by using a two-beam interference exposition method and etching. Then, a regrowth process is performed by MOCVD to form an n-$Al_{0.5}Ga_{0.5}As$ carrier barrier layer 13 (average thickness: about 0.2 μm), an undoped $Al_{0.23}Ga_{0.77}As$ embedded layer 14 (average thickness: about 0.1 μm), a p-$Al_{0.6}Ga_{0.4}As$ cladding layer 16 (thickness: about 0.8 μm), and a p-GaAs contact layer 17 (thickness: about 0.5 μm). As the undoped $Al_{0.23}Ga_{0.77}As$ embedded layer 14 is grown, a region having a lower Al component ratio than that of the embedded layer 14 is formed so as to extend from the bottom of each concave portion, along a direction perpendicular to the surface of the substrate. In each of these regions is formed a vertical quantum well (VQW) structure active layer 15 extending along the concave portion.

Thereafter, the portion of the GaAs contact layer 17 and the cladding layer 16 which lies outside of a stripe-like optical waveguide portion is removed, thereby leaving a ridge stripe (width: 2 μm). Then, electrodes 181 and 182 are deposited upon the ridge and the lower face of the substrate. Finally, the wafer is cleaved, whereby the semiconductor laser device is completed.

In the present example, the undoped $Al_{0.23}Ga_{0.77}As$ embedded layer 14 is formed during a MOCVD growth process in which the respective parameters are gradually varied in the following ranges: (growth pressure) about 50 Torr to about 76 Torr; (growth temperature) about 700° to about 730°; (ratio of the V group material to the III group material present In the mixture) about 100 to about 60; and (growth rate) about 10 nm/min to about 30 nm/min. Since the migration rate of Ga is greater than that of Al, Ga tends to migrate over to the concave portions of the undulation, resulting in a relatively large amount of Ga being supplied in the concave portions. Thus, regions defining vertical quantum well (VQW) structure active layers 15, having a lower Al component ratio than that of the other portions of the undoped $Al_{0.23}Ga_{0.77}As$ embedded layer 14, are formed along the respective concave portions so as to extend along a direction perpendicular to the surface of the substrate.

The energy wavelength of the VQW structures were determined by photoluminescence measurement to be about 780 nm. In the case where the energy wavelength of the VQW structures is 780 nm, the Al molar fraction (m) of the semiconductor ($Al_mGa_{1-m}As$) forming the VQW structures is in the range of about 0–0.14. The Al molar fraction is calculated from the energy wavelength of the VQW structures, thus the Al molar fraction changes corresponding to a change of the energy wavelength. In the present invention, the Al molar fraction of the VQW structures is not limited to the above value. This also applies to the following examples. When a current is injected into this device, confinement of carriers takes place within the VQW structures so that periodic changes of gain occur along the cavity direction. Thus, the VQW structures function as a gain diffraction grating, thereby providing a GC-DFB semiconductor laser device.

The n-$Al_{0.5}Ga_{0.5}As$ carrier barrier layer 13 grows while retaining the underlying-undulation so that the upper surface of the n-$Al_{0.5}Ga_{0.5}As$ carrier barrier layer 13 exhibits substantially the same undulation. Although what may be considered as VQW structures will also be formed during the growth of the n-$Al_{0.5}Ga_{0.5}As$ carrier barrier layer 13 due to such an undulation, the VQW structures 15 within the undoped $Al_{0.23}Ga_{0.77}As$ embedded layer 14 are more stable energywise. Therefore, gain occurs in the VQW structures 15 within the undoped $Al_{0.23}Ga_{0.77}As$ embedded layer 14.

Figure 2:
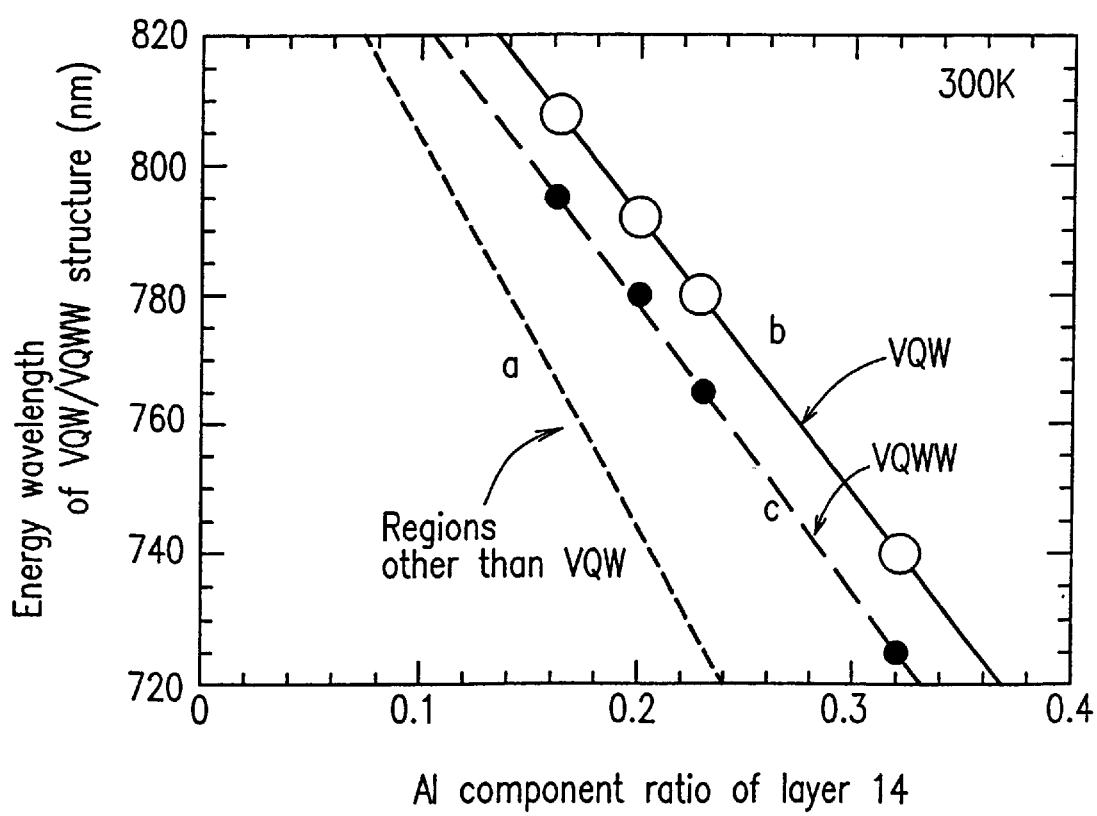
FIG. 2 is a graph illustrating the relationship between the Al component ratio of an embedded layer for burying an undulation (including convex and concave portions) and the energy wavelength of VQW structures formed within the embedded layer.

FIG. 2 is a graph illustrating the relationship between the Al component ratio of the embedded layer 14 and the energy wavelength of the VQW structures 15 formed within the embedded layer 14, as determined by photoluminescence measurement. In FIG. 2, the horizontal axis represents the Al component ratio of the embedded layer 14, whereas the vertical axis represents the energy wavelength as determined by photoluminescence measurement.

In the present example, the undoped $Al_{0.23}Ga_{0.77}As$ embedded layer 14 has an Al component ratio of 0.23, with a corresponding energy wavelength of 725 nm (as indicated by a broken line a in FIG. 2). The energy wavelength of the resulting VQW structures 15 under these conditions is about 780 nm (as indicated by a solid line b in FIG. 2). Thus, it will be seen that the VQW structures 15 define regions having a lower Al component ratio (and hence a higher energy wavelength) than that of the embedded layer 14. By selecting an appropriate Al component ratio from the graph of FIG. 2, it becomes possible to design the active layers 15 with a desired energy wavelength. For example, the active layers 15 can be designed so as to have an energy wavelength of about 780 nm by prescribing the Al component ratio of the embedded layer 14 at 0.23 so that the resultant VQW structures will define the active layers as desired.

In order to attain the aforementioned objectives of the present invention, it is preferable to prescribe the Al component ratio of the embedded layer 14 at a value ranging from about 0.1 to about 0.3. In terms of growing a semiconductor crystal while keeping the shape of the undulation underlaid, the semiconductor constituting the carrier barrier layer 13 preferably has an Al component ratio of 0.45 or more.

Since the VQW active layers 15 are formed within the undoped $Al_{0.23}Ga_{0.77}As$ embedded layer 14 in the present example, there is no regrowth interface created within the active layers 15. The defects in the semiconductor crystal structure which may emerge at the regrowth interface during the undulation formation and a series of preceding or following steps will be gradually covered by the carrier barrier layer 13 which is grown afresh on the regrowth interface. Thus, the VQW active layers 15 formed on the carrier barrier layer 13 achieve a semiconductor crystal structure which is substantially free of defects. As a result, the recombination component due to crystal defects is minimized, whereby high reliability is attained.

Figure 3:
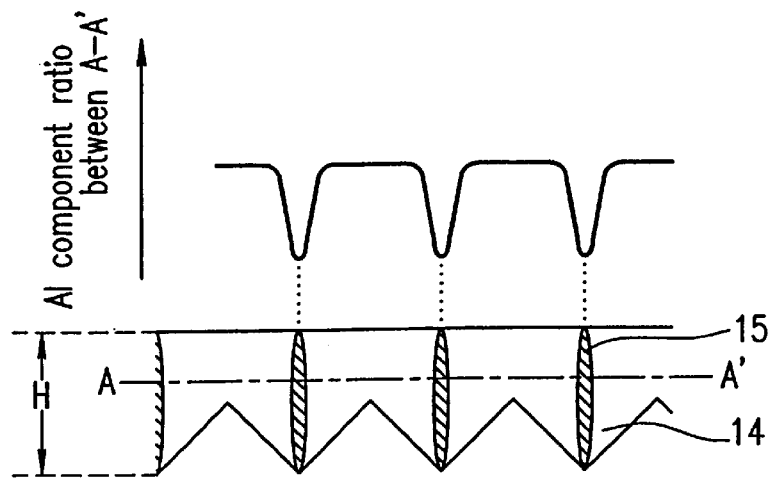
FIG. 3 illustrates an Al component ratio profile corresponding to a diffraction-grating section.

FIG. 3 illustrates an Al component ratio profile corresponding to a diffraction grating section. As seen from the figure, VQW structures are spontaneously formed in response to the migration of the materials used, so that the interfaces of the quantum wells naturally attain a graded structure in which the Al component ratio undergoes a gradual change. As a result, emission recombination is effectively achieved, thereby increasing the gain coupling coefficient.

In order to lower the oscillation threshold of a DFB laser device, a gain coupling coefficient K gL, which is a parameter representing the degree of a distributed feedback of light which is obtained with a gain diffraction grating, should desirably be maximized. The gain coupling coefficient can be increased by ensuring that the periodically varying gain within the active layers varies by a large difference.

Figure 4A:
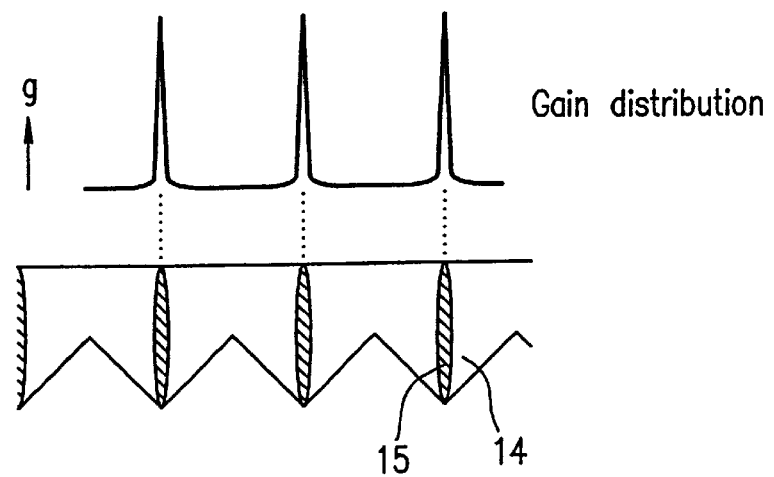
FIG. 4A illustrates a gain distribution pattern over a diffraction grating section of an example according to the present invention.
Figure 4B:
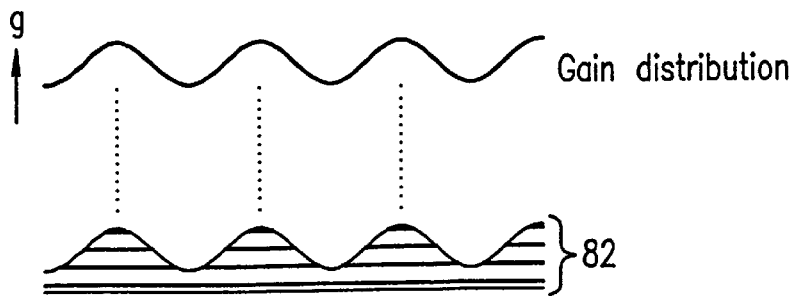
FIG. 4B illustrates a gain distribution pattern over a diffraction grating section of a conventional example.

In the present example, a quantum well structure is used for the active layers, leading to a high carrier density in the active layers and hence a high gain. Moreover, with respect to the direction of light propagation, the gain substantially concentrates in the VQW active layers (which are formed within the embedded layer so as to extend along a direction perpendicular to the surface of the substrate), while substantially no gain exists in portions other than the VQW active layers. Thus, a large difference in gain is obtained, thereby increasing the aforementioned gain coupling coefficient. FIG. 4A illustrates a gain distribution pattern obtained with the VQW gain grating active layers according to the present invention. FIG. 4B illustrates a gain distribution pattern obtained with a conventional quantum well gain grating active layer. As seen from FIG. 4A, a larger difference between the active layers and the other portions is obtained in the gain distribution pattern according to the present example.

Since the VQW structures can be easily constructed through self-alignment, VQW structures can be obtained with good reproducibility, and the gain coupling coefficient can be controlled also with good reproducibility.

Since a high gain coupling coefficient is obtained with good reproducibility, a low threshold gain can be obtained with good reproducibility. As a result, the operation current of the semiconductor laser is reduced with an improved reproducibility. A high reliability is also provided because no regrowth interface exists within the active layers.

The inventors have confirmed that similar effects can be provided without varying the growth conditions during the growth of the undoped $Al_{0.23}Ga_{0.77}As$ embedded layer 14. However, as the undulation is gradually buried to become flat with the progress of growth, the migration of Ga to the concave portions of the undulation gradually decreases, thereby resulting in a gradual decrease of the amount of Ga supplied in the concave portions. As a result, the well width in the VQW structures gradually decreases, and the Al component ratio of the concave portions gradually increases so as to become closer to that of the undoped $Al_{0.23}Ga_{0.77}As$ embedded layer 14.

According to the present example, however, the undoped $Al_{0.23}Ga_{0.77}As$ embedded layer 14 is formed while varying the growth conditions during its growth, as described above. Specifically, as the undulation is buried toward flatness, the growth pressure is decreased, the growth temperature increased, the ratio of the V group material to the III group material decreased, and the growth rate decreased, thereby maintaining sufficient migration. As a result, even though the growth surface becomes flattened as the undulation is buried, the Ga and Al materials retain the same relative migration behavior. In other words, the Ga migration to the concave portions does not gradually diminish, nor does the Ga supply to the concave portions decrease. Thus, the well width and the Al component ratio of the VQW structures within the undoped $Al_{0.23}Ga_{0.77}As$ embedded layer 14 can be made uniform. As a result, excellent carrier confinement occurs, thereby increasing the gain in the VQW structures and further increasing the gain coupling coefficient.

Generally, in the case where a quantum well structure exists in an optical waveguide region, the transition probability of light having a field component which is parallel to the quantum well layers becomes higher than the transition probability of light having a field component which is perpendicular to the quantum well layers. As a result, light having a field component which is parallel to the quantum well layers enjoys a higher gain. In a usual growth process, quantum wells are formed so as to extend in parallel to the surface of the substrate by lamination of the semiconductor layers. In such quantum wells, the TE light defines a field component which is parallel to the quantum wells, and the TM light defines a field component which is perpendicular to the quantum wells. Hence, the TE mode light enjoys a higher gain than the TM mode light, so that only the TE mode light enjoys a periodically varying gain. Such a device cannot be used in applications which require the TM mode.

In contrast, the VQW structures according to the present example include quantum wells extending perpendicularly to the direction of light propagation, so that both TE mode light and TM mode light provide a field distribution which is parallel to the quantum wells. As a result, gain exists for both TE mode light and TM mode light, thereby allowing for both TE oscillation and TM oscillation with the use of an appropriate structure. Thus, the present example provides greater design flexibility.

The height (indicated as H in FIG. 3) of the VQW structures is determined by the thickness of the embedded layer 14, or a thickness at which the embedded layer 14 attains substantial flatness. As the height of the VQW structures increases, more sensitivity to light is provided so that the gain increases, thereby increasing the gain coupling coefficient, reducing the oscillation threshold of the semiconductor laser, and enhancing the reliability of the device. Through an experiment where the height of the VQW structures was varied, the inventors confirmed that the VQW structures with a height of about 60 nm or more provide a sufficient gain coupling coefficient, while a height of about 100 nm or more is preferable for an enhanced gain coupling efficient.

In the present example, the undulation has a period of a first order diffraction grating with respect to the oscillation wavelength. The inventors also confirmed that similar effects to the above can be provided with an undulation having a period of a higher order diffraction grating.

The aforementioned effects of the present example can be provided virtually regardless of the depth (indicated as N in FIG. 1) of the undulation. However, if the etching performed for the formation of the undulation exceeds the thickness of the guide layer 12 (which defines the undulation) down to the cladding layer 11, a regrowth interface having a high Al component ratio will emerge, thereby resulting in lower crystallinity of the embedded layer 14 formed thereupon and hence low reliability. Therefore, it is preferable that the depth N of the undulation does not exceed the thickness of the guide layer 12 defining the undulation.

On the other hand, if the depth N of the undulation is smaller than 40 nm, sufficient migration will not be attained during the growth of the embedded layer 14, thereby hindering the formation of the VQW structures. Therefore, it is preferable that the depth N of the undulation is about 40 nm or more.

Although the undulation underlying the embedded layer in which the VQW structures are formed has a triangular wave shape according to the present example, the bottom of each triangular shape can be arranged to form a flat or curved surface, whereby it becomes possible to control the well width of the VQW structures based on the width of such a flat or curved surface. In this case, the width of the flat or curved surface is preferably about 30 nm or less, and most preferably in the vicinity of 10 nm because, if the width exceeds about 30 nm, it becomes impossible to ensure a large difference in the Al component ratio between the concave portions and the other portions of the embedded layer 14, thereby hindering light confinement. The width of the flat or curved surface of the bottom of each triangular shape can of course be 0 nm, whereby the VQW structures and the aforementioned effects of the present example can be secured. The boundaries between the flat or curved surface and the slopes (i.e., lateral surfaces) of each triangular shape may be steep or gentle. For example, satisfactory VQW structures can be obtained by jointing lateral surfaces formed of the (111) plane to a bottom surface formed of the (100) plane via a boundary portion formed of the (311) plane.

Although the present example illustrates an AlGaAs embedded layer, similar effects can also be obtained by using other material systems employing Al and Ga as the III group materials. For example, a device incorporating an embedded layer formed of AlGaInP oscillates at 650 nm, providing the aforementioned effects of the present example.

The n-$Al_{0.5}Ga_{0.5}As$ carrier barrier layer 13 according to the present example is illustrated to have an average thickness of about 0.2 $\mu$m. However, the average thickness of this layer can be as large as about 0.8 $\mu$m and its surface will still maintain the shape of the underlying undulation, so that satisfactory VQW structures are formed in the overlying undoped $Al_{0.23}Ga_{0.7}As$ embedded layer 14, thereby providing a GC-DFB semiconductor laser device. In this case, the defects in the semiconductor structure at the regrowth interface emerging during the undulation formation and a series of preceding or following steps are further reduced due to the large thickness of the carrier barrier layer 13, and the overlying VQW active layers 15 achieve a semiconductor crystal structure with even fewer defects. As a result, the recombination component due to crystal defects is minimized, whereby high reliability can be attained.

Under the condition that the Al component ratio of the carrier barrier layer 13 is about 0.45 or more, the surface of the carrier barrier layer 13 retains substantially the same shape as that of the underlying undulation, thereby providing the aforementioned effects of the present example. If the Al component ratio of the carrier barrier layer 13 is less than about 0.45, the carrier barrier layer 13 gradually loses its undulated shape, however, so long as the undulation secures a depth of about 40 nm or more as measured from the upper surface of the carrier barrier layer 13, VQW structures can be satisfactorily formed within the overlying embedded layer 14, thereby providing the aforementioned effects of the present example.

Example 2

Figure 5:
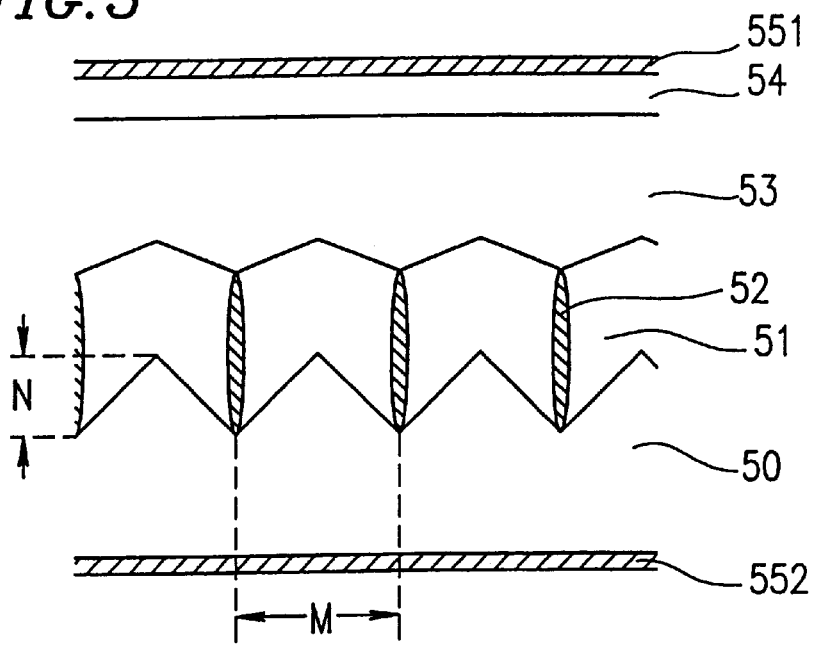
FIG. 5 is a cross-sectional view illustrating the structure of a GC-DFB semiconductor laser device according to Example 2 of the present invention.

FIG. 5 is a cross-sectional view illustrating the structure of a GC-DFB semiconductor laser device according to Example 2 of the present invention, taken along the direction of its laser cavity.

According to the present example, an undoped $In_pGa_{1-p}As_qP_{1-q}$ embedded layer 51 (thickness: about 200 nm; energy wavelength $\lambda$ g: about 1.4 $\mu$m; p: about 0.65; q: about 0.76) is grown on an n-InP staggered substrate 50. The n-InP staggered substrate 50 has an undulation (period M: about 250 nm; depth N: about 220 nm). Then, a p-InP cladding layer 53 (thickness: about 1.5 $\mu$m) and a p-InGaAs contact layer 54 (thickness: about 200 $\mu$m) are formed in this order by MOCVD. As the undoped InGaAsP embedded layer 51 is grown, a layer 52 having a lower energy bandgap than that of the undoped InGaAsP embedded layer 51 is formed so as to extend from the bottom of each concave portion, along a direction perpendicular to the surface of the substrate. In this example, the molar fractions u and v of the layer 52 ($In_uGa_{1-u}As_vP_{1-v}$) are about 0.76. However, the values of u and v change corresponding to a change of the process condition. In the present invention, the values of u and v are not limited to 0.76.

Thus, VQW structure active layers 52 are formed in the concave portions of the undulation. Thereafter, electrodes 551 and 552 are deposited, and the wafer is cleaved, whereby the semiconductor laser device is completed.

According to the present example, since the migration rate of In is greater than that of Ga during the growth of the undoped InGaAsP embedded layer 51, In tends to migrate over to the concave portions of the undulation at the growing surface of the undulation, resulting in a relatively large amount of In being supplied in the concave portions. Thus, regions having a higher In component ratio are formed so as to extend from the bottom of each concave portion of the undulation, along a direction perpendicular to the surface of the substrate, defining VQW structures. Thus, the VQW active layers 52 are formed through self-alignment.

The energy wavelength $\lambda$ g of the VQW structures were determined by photoluminescence measurement to be about 1.55 $\mu$m.

When a current is injected into this device, confinement of carriers takes place within the periodically distributed VQW structures so that periodic changes of gain occur along the cavity direction. Thus, the VQW structures function as a gain diffraction grating, thereby providing a GC-DFB semiconductor laser device.

According to the present example, the lower ends of the VQW structures, emerging at the bottoms of the concave portions of the undulation of the substrate, also define regrowth interfaces. However, since the other portions of the VQW active layers 52 are formed within the undoped InGaAsP embedded layer 51, major portions of the active layers 51 are free of regrowth interfaces. Thus, the defects in the semiconductor crystal structure which could emerge at regrowth interfaces are sufficiently reduced. As a result, the recombination component due to crystal defects is minimized, whereby high reliability is attained.

Moreover, the use of a quantum well structure in the active layers provides an increased carrier density within the active layer and hence a large gain. In addition, the gain substantially concentrates in the VQW active layers (which are formed within the embedded layer so as to extend along a direction perpendicular to the surface of the substrate), while substantially no gain exists in portions other than the VQW active layers. Thus, a large difference in gain is obtained, thereby providing a high gain coupling coefficient.

The VQW structures are spontaneously formed in response to the migration of the materials used, so that the interfaces of the quantum wells naturally attain a graded structure in which the In component ratio undergoes a gradual change. As a result, light emission recombination is effectively achieved, thereby increasing the gain coupling coefficient.

Since the VQW structures can be easily constructed through self-alignment, the gain coupling coefficient can be controlled with good reproducibility.

Since a high gain coupling coefficient is obtained with good reproducibility, a low threshold gain can be obtained with good reproducibility. As a result, the operation current of the semiconductor laser is reduced with an improved reproducibility.

The VQW structures according to the present example include quantum wells extending perpendicularly to the direction of light propagation, so that both TE mode light and TM mode light provide a field distribution which is parallel to the quantum wells. As a result, the quantum well active layers provide a gain for both TE mode light and TM mode light, thereby allowing for both TE oscillation and TM oscillation with the use of an appropriate structure. Thus, the present example provides greater design flexibility.

Although the present example illustrates an InGaAsP embedded layer, similar effects can also be obtained by using other material systems employing In and Ga as the III group materials. For example, a device incorporating an embedded layer formed of GaInNAs oscillates at about 1.3 $\mu$m, providing the aforementioned effects of the present example.

The migration of the respective materials may vary depending on the growth condition and the materials used. Although the above examples illustrated VQW structures, i.e., structures in which the energy bandgap of the semiconductor in the concave portions of the undulation becomes smaller than that of the semiconductor in regions other than the concave portions, the growth conditions can be adjusted to change the migration of the respective materials so that the energy bandgap of the semiconductor in the concave portions of the undulation becomes larger than that of the semiconductor in regions other than the concave portions. In Example 2, for example, the In component ratio in the concave portions can be made smaller than that in the other regions so that the regions other than the concave portions having a smaller energy bandgap function as active layers interposed between concave portions having a larger energy bandgap. Thus, the gain is periodically modified so that the device can operate as a GC-DFB laser device, thereby providing the same effects. However, such a configuration will not provide as large a gain as that provided by VQW structures. Therefore, for greater effects, it is preferable that the energy bandgap of the semiconductor in the concave portions of the undulation is smaller than that of the semiconductor in regions other than the concave portions, thereby providing VQW structures.

Example 3

Figure 6:
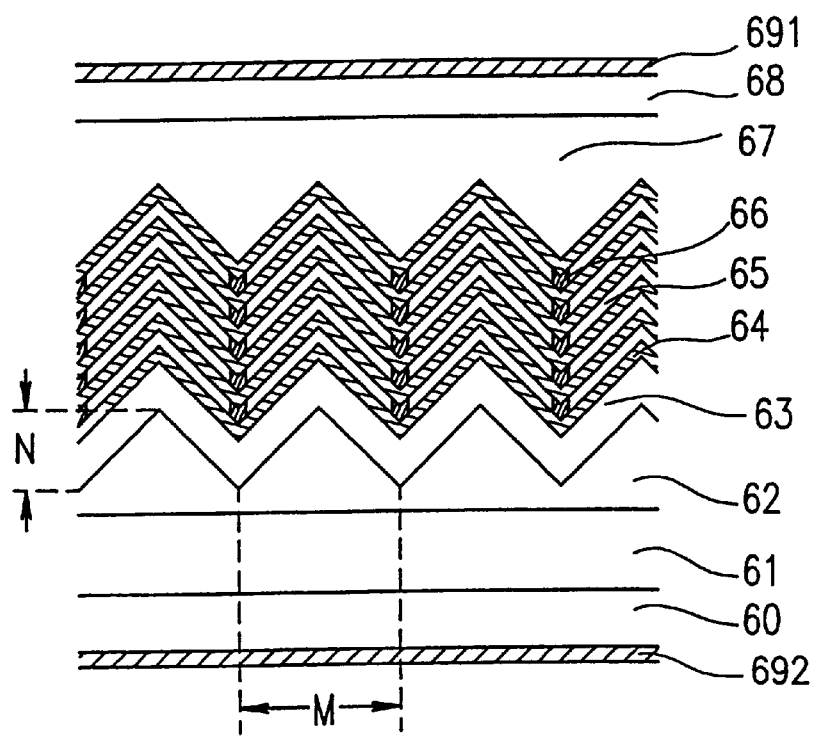
FIG. 6 is a cross-sectional view illustrating the structure of a GC-DFB semiconductor laser device according to Example 3 of the present invention.

FIG. 6 is a cross-sectional view illustrating the structure of a GC-DFB semiconductor laser device according to Example 3, taken along the direction of a laser cavity within its ridge.

According to the present example, a p-$Al_{0.6}Ga_{0.4}As$ cladding layer 61 (thickness: about 1 $\mu$m) and a p-$Al_{0.2}Ga_{0.8}As$ guide layer 61 (thickness: about 0.2 $\mu$m) are formed on a p-GaAs substrate 60 by MOCVD. Next, an undulation including convex and concave portions is impressed on the uppermost layer among the growth layers so as to have a period M of about 360 nm and a depth N of about 150 nm, by using a two-beam interference exposition method and etching. Then, a regrowth process is performed by MOCVD to form 5.5 rounds of a lamination including: a p-$Al_{0.5}Ga_{0.5}As$ carrier barrier layer 63 (average thickness: about 0.2 $\mu$m) an undoped $Al_{0.35}Ga_{0.65}As$ embedded barrier layer 64 (average thickness: about 10 nm); and an undoped $Al_{0.2}Ga_{0.8}As$ embedded layer 65 (average thickness: about 10 nm), followed by an n-$Al_{0.6}Ga_{0.4}As$ cladding layer 67 (thickness: about 0.8 $\mu$m), and an n-GaAs contact layer 68 (thickness: about 0.5 $\mu$m). As each undoped $Al_{0.2}Ga_{0.8}As$ embedded layer 65 is grown, a region defining a vertical quantum well wire (VQWW) structure active layer 66 ($Al_nGa_{1-n}As$; where n is in the range of 0 to 0.14), having a lower Al component ratio than that of the embedded layer 65, is formed in each concave portion. By growing alternating undoped $Al_{0.35}Ga_{0.65}As$ embedded layers 64 and undoped $Al_{0.2}Ga_{0.8}As$ embedded layers 65, VQWW structures are laminated along a direction perpendicular to the surface of the substrate.

Thereafter, the portion of the GaAs contact layer 68 and the cladding layer 67 which lies outside of it a stripe-like optical waveguide portion is removed, thereby leaving a ridge stripe (width: about 2 $\mu$m). Then, electrodes 691 and 692 are deposited upon the ridge and the lower face of the substrate. Finally, the wafer is cleaved, whereby the semiconductor laser device is completed.

In the present example, the undoped $Al_{0.2}Ga_{08}As$ embedded layers 65 are formed during a MOCVD growth process under the following conditions: a growth pressure of about 76 Torr; a growth temperature of about 700° C.; a ratio of the V group material to the III group material present in the mixture of about 120; and a growth rate of about 25 nm/min. Since the migration rate of Ga is greater than that of Al, Ga tends to migrate over to the concave portions of the undulation, resulting in a relatively large amount of Ga being supplied in the concave portions. Thus, regions defining quantum well wire (VQWW) structure active layers 66, having a lower Al component ratio than that of the other portions of the undoped $Al_{0.2}Ga_{0.8}As$ embedded layers 65, are formed along the respective concave portions, so as to be interposed between the overlying and underlying embedded barrier layers 64. In the present example, five undoped $Al_{0.2}Ga_{0.8}As$ embedded layers 65 are grown between the embedded barrier layers 64, thereby providing five stages of VQWW structures along a direction perpendicular to the surface of the substrate.

The p-$Al_{0.5}Ga_{0.5}As$ carrier barrier layer 63 grows while retaining the underlying undulation so that the upper surface of the carrier barrier layer 63 exhibits substantially the same undulation. Although the Al component ratios of the concave portions resulting after the growth of the carrier barrier layer 63 and the undoped $Al_{0.35}Ga_{0.63}As$ embedded layers 65 also become somewhat smaller, the concave portions within the undoped $Al_{0.2}Ga_{0.8}As$ embedded layers 65 are the most stable energywise. Therefore, gain occurs in the VQWW structures 66 formed within the undoped $Al_{0.2}Ga_{0.8}As$ embedded layers 65.

As seen from the data indicated by the broken line c in FIG. 2, the energy wavelength of the VQWW active layers 66 were determined by photoluminescence measurement to be about 780 nm. When a current is injected into this device, confinement of carriers takes place within the VQWW structures so that periodic changes of gain occur along the cavity direction. Thus, the VQWW structures function as a gain diffraction grating, thereby providing a GC-DFB semiconductor laser device.

Since the VQWW active layers 66 are formed within the undoped $Al_{0.2}Ga_{0.8}As$ embedded layers 65 and in between the undoped $Al_{0.35}Ga_{0.65}As$ embedded barrier layers 64 in the present example, there is no regrowth interface created within the active layers 66. The defects in the semiconductor crystal structure which may emerge at the regrowth interface during the undulation formation and a series of preceding or following steps will be gradually covered by the carrier barrier layer 63 which is grown afresh on the regrowth interface. Thus, the VQWW active layers 66 formed on the carrier barrier layer 63 achieve a semiconductor crystal structure which is substantially free of defects. As a result, the recombination component due to crystal defects is minimized, whereby high reliability is attained.

In the present example, since a quantum well wire structure is used for the active layers, the active layers have an even higher carrier density than that provided by a quantum well structure, thereby resulting in a further increased gain. Moreover, with respect to the direction of light propagation, the gain substantially concentrates in the VQWW active layers (which are arranged along a direction perpendicular to the surface of the substrate), while substantially no gain exists in portions other than the VQWW active layers. Thus, a large difference in gain is obtained, thereby increasing the aforementioned gain coupling coefficient.

The VQWW structures are spontaneously formed (i.e., along the lateral direction) in response to the migration of the materials used, so that the interfaces of the quantum wells naturally attain a graded structure in which the component ratio of the semiconductor layer undergoes a gradual change. As a result, light emission recombination is effectively achieved, thereby increasing the gain coupling coefficient.

Since the VQWW structures can be easily constructed through self-alignment, VQWW structures can be obtained with good reproducibility.

Since a high gain coupling coefficient is obtained with good reproducibility, a low threshold gain can be obtained with good reproducibility. As a result, the operation current of the semiconductor laser is reduced with an improved reproducibility. A high reliability is also provided because no regrowth interface exists within the active layers.

The VQWW structures according to the present example include quantum well wires extending laterally with respect to the direction of light propagation, so that the VQWW structures provide a gain for the TE mode light which provides a field distribution parallel to the quantum well wires. Therefore, it is possible to select TE oscillation in accordance with the present example.

Example 4

Figure 7:
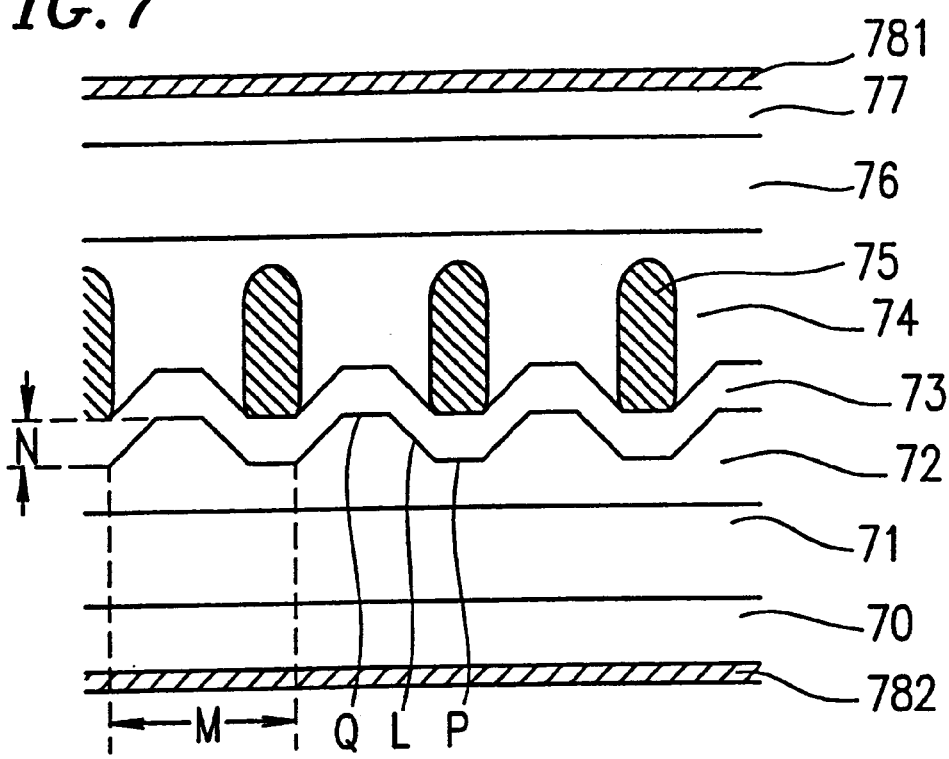
FIG. 7 is a cross-sectional view illustrating the structure of a GC-DFB semiconductor laser device according to Example 4 of the present invention.
Figure 8:
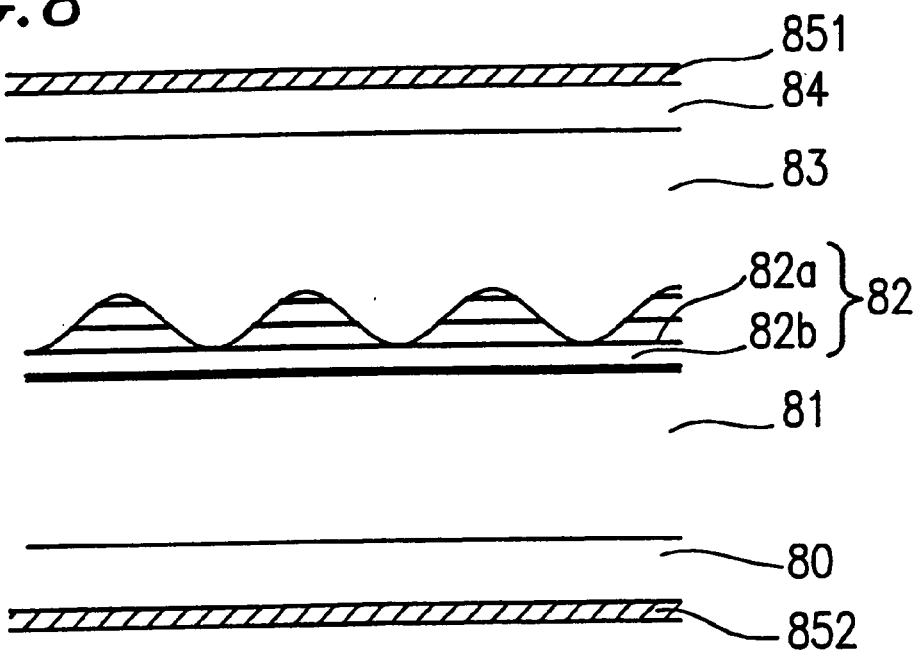
FIG. 8 is a cross-sectional view illustrating the structure of a conventional GC-DFB semiconductor laser device.

FIG. 7 is a cross-sectional view illustrating the structure of a GC-DFB semiconductor laser device according to Example 4, taken along the direction of a laser cavity within its ridge.

According to the present example, an n-$Al_{0.6}Ga_{0.4}As$ cladding layer 71 (thickness: about 1 $\mu$m) and an n-$Al_{0.3}Ga_{0.7}As$ guide layer 72 (thickness: about 0.1 $\mu$m) are formed on an n-GaAs substrate 70 by MOCVD. Next, a trapezoidal undulation including convex and concave portions is impressed on the uppermost layer among the growth layers so as to have a period M of about 240 nm and a depth N of about 50 nm, by using a two-beam interference exposition method and etching. Specifically, the undulation includes trapezoidal concave or convex portions, each having a bottom p (width: about 20 nm) or an apex Q (width: about 140 nm) and slopes L. Then, a regrowth process is performed by MOCVD to form an n-$Al_{0.5}Ga_{0.5}As$ carrier barrier layer 73 (average thickness: about 0.1 $\mu$m), an undoped $Al_{0.28}Ga_{0.72}As$ embedded layer 74 (average thickness: about 0.1 $\mu$m), a p-$Al_{0.6}Ga_{0.4}As$ cladding layer 76 (thickness: about 0.8 $\mu$m), and a p-GaAs contact layer 77 (thickness: about 0.5 $\mu$m). As the undoped $Al_{0.28}Ga_{0.72}As$ embedded layer 74 is grown, a region ($Al_wGa_{1-w}As$, w: about 0.13) having a lower Al component ratio than that of the embedded layer 74 is formed so as to extend from the bottom of each concave portion, along a direction perpendicular to the surface of the substrate. In each of these regions is formed a DH structure active layer 75 extending along the concave portion, the DH structures having the same period as that of the concave and convex portions of the undulation.

Thereafter, the portion of the GaAs contact layer 77 and the cladding layer 76 which lies outside of a stripe-like optical waveguide portion is removed, thereby leaving a ridge stripe (width: about 2 $\mu$m). Then, electrodes 781 and 782 are deposited upon the ridge and the lower face of the substrate. Finally, the wafer is cleaved, whereby the semiconductor laser device is completed.

In the present example, the undoped $Al_{0.28}Ga_{0.72}As$ embedded layer 74 is formed during a MOCVD growth process under the following conditions: a growth pressure of about 50 Torr; a growth temperature of about 650° C.; a ratio of the V group material to the III group material present in the mixture of about 180; and a growth rate of about 10 nm/min. Since the migration rate of Ga is greater than that of Al, Ga tends to migrate over to the concave portions of the undulation, resulting in a relatively large amount of Ga being supplied in the concave portions. Thus, regions defining DH structure active layers 75 ($Al_mGa_{1-m}As$; where m is about 0.13), having a lower Al component ratio than that of the other portions of the undoped $Al_{0.28}Ga_{0.72}As$ embedded layer 74, are formed along the respective concave portions so as to extend along a direction perpendicular to the surface of the substrate.

Since the bottom of each convex portion of the underlying undulation is about 20 nm wide, each resultant active region 75 having a lower Al component ratio is also about 20 nm wide. As the undulation is buried toward flatness, eventually the growth surface attains substantial flatness, at which point the material migration becomes uniform so that differential migration no longer exists. Thus, the formation of the DH structures stops with the disappearance of differential Al component ratios.

In order to form DH structures that provide desired variation in gain, the width p of the bottom (which defines a flat portion) of each convex portion is preferably prescribed at a value in the range from about 0 nm to about 30 nm. It is also preferable that the lateral surfaces (slopes) and the bottoms of the concave and convex portions are formed of the (n11) plane and the (100) plane, respectively, of the semiconductor used.

Under the growth conditions according to the present example, the undoped $Al_{0.28}Ga_{0.72}As$ embedded layer 74 grows in such a manner that the growth surface becomes substantially flat at the thickness (as measured from the bottom) of about 80 nm, so that no DH structures are formed in any subsequently-grown portion of the undoped $Al_{0.28}Ga_{0.72}As$ embedded layer 74. Thus, the DH structures according to the present example each have a width of about 20 nm and a height of about 80 nm.

The energy wavelength of the DH structures were determined by photoluminescence measurement to be about 780 nm. When a current is injected into this device, confinement of carriers takes place within the DH structures so that periodic changes of gain occur along the cavity direction.

Thus, the DH structures function as a gain diffraction grating, thereby providing a GC-DFB semiconductor laser device.

The n-$Al_{0.5}Ga_{0.5}As$ carrier barrier layer 73 grows while retaining the underlying undulation so that the upper surface of the n-$Al_{0.5}Ga_{0.5}As$ carrier barrier layer 73 exhibits substantially the same undulation. Although regions having a somewhat lower Al component ratio will also be formed during the growth of the n-$Al_{0.5}Ga_{0.5}As$ carrier barrier layer 73 due to such an undulation, the low-Al component ratio regions 75 within the undoped $Al_{0.28}Ga_{0.72}As$ embedded layer 74 are more stable energywise. Therefore, gain occurs in the DH structures 75 within the undoped $Al_{0.28}Ga_{0.72}As$ embedded layer 74.

Since the DH active layers 75 are formed within the undoped $Al_{0.28}Ga_{0.72}As$ embedded layer 74 in the present example, there is no regrowth interface created within the active layers 75. The defects in the semiconductor crystal structure which may emerge at the regrowth interface during the undulation formation and a series of preceding or following steps will be gradually covered by the carrier barrier layer 73 which is grown afresh on the regrowth interface. Thus, the DH active layers 75 formed on the carrier barrier layer 73 achieve a semiconductor crystal structure which is substantially free of defects. As a result, the recombination component due to crystal defects is minimized, whereby high reliability is attained.

In the present example, with respect to the direction of light propagation, the gain substantially concentrates In the DH active layers (which are formed within the embedded layer 74 so as to extend along a direction perpendicular to the surface of the substrate), while substantially no gain exists in portions other than the DH active layers. Thus, a large difference in gain is obtained, thereby increasing the aforementioned gain coupling coefficient.

The DH structures are spontaneously formed in response to the migration of the materials used, so that the interfaces of the DH structures naturally attain a graded structure in which the Al component ratio undergoes a gradual change. As a result, light emission recombination is effectively achieved, thereby increasing the gain coupling coefficient.

Since the DH structures can be easily constructed through self-alignment, DH structures can be obtained with good reproducibility.

Since a high gain coupling coefficient is obtained with good reproducibility, a low threshold gain can be obtained with good reproducibility. As a result, the operation current of the semiconductor laser is reduced with an improved reproducibility. A high reliability is also provided because no regrowth interface exists within the active layers.

As described above, in accordance with a GC-DFB semiconductor laser device of the present invention, as an undulation portion is buried with an embedded layer and the like, the differential migration of the materials used results in concave portions of the undulation having a III group element component ratio which is different from that of the other portions, whereby vertical quantum well structures (VQW) or quantum well wires (VQWW) are formed. Due to the periodic arrangement of the VQW or VQWW structures, when a current is injected into this device, confinement of carriers takes place within the VQW or VQWW structures so that periodic changes of gain occur. Thus, the VQW or VQWW structures function as a gain diffraction grating, thereby providing a GC-DFB semiconductor laser device. Since the VQW or VQWW active layers can be easily constructed through self-alignment, the gain coupling coefficient can be controlled with good reproducibility, thereby resulting in a high yield.

By implementing the active layers as VQW structures, the area of the active layers which is in contact with any regrowth interface is minimized, so that the effects of any defects in the semiconductor crystal structure which may emerge at regrowth interfaces during the undulation formation and a series of preceding or following steps can be minimized. By further incorporating a carrier barrier layer after the formation of the undulation, the defects in the semiconductor crystal structure which may emerge at the regrowth interface will gradually become covered by the carrier barrier layer. Thus, the VQW or VQWW active layers formed on the carrier barrier layer achieve a semiconductor crystal structure which is substantially free of defects As a result, the recombination component due to crystal defects is minimized, whereby high reliability is attained.

Moreover, the use of a VQW or VQWW structure in the active layers provides an increased carrier density within the active layer and hence a large gain. In addition, the gain substantially concentrates in the VQW or VQWW active layers (which are formed within the embedded layer so as to extend along a direction perpendicular to the surface of the substrate), while substantially no gain exists in portions other than the VQW active layers. Thus, a large difference in gain is obtained, thereby providing a high gain coupling coefficient.

The embedded layer according to the present invention is formed while varying the growth conditions during its growth in such a manner that, as the undulation is buried toward flatness, the growth pressure is decreased, the growth temperature increased, the ratio of the V group material to the III group material decreased, and the growth rate decreased, thereby providing uniform well widths and component ratios of the VQW structures within the embedded layer. As a result, excellent carrier confinement occurs, thereby increasing the gain in the VQW structures and the gain coupling coefficient.

Since the VQW structures are spontaneously formed in response to the migration of the materials used, so that the interfaces of the quantum wells naturally attain a graded structure in which the In component ratio undergoes a gradual change. As a result, light emission recombination is effectively achieved, thereby increasing the gain coupling coefficient.

Since the VQW or VQWW structures can be easily constructed through self-alignment, it is possible to control the VQW or VQWW structures with good reproducibility.

Since a high gain coupling coefficient is obtained with good reproducibility, a low threshold gain can be obtained with good reproducibility. As a result, the operation current of the semiconductor laser is reduced with an improved reproducibility. A high reliability is also provided because no regrowth interface exists within the active layers.

The VQW structures according to the present invention include quantum wells extending perpendicularly to the direction of light propagation, so that the quantum well active layers oscillate in both TE and TM modes. Thus, TE oscillation or TM oscillation can be provided as desired, with the use of an appropriate structure.

Since the VQWW structures according to the present invention include quantum well wires extending laterally with respect to the direction of light propagation, the VQWW structures provide a gain for the TE mode light which provides a field distribution parallel to the quantum well wires. Therefore, it is possible to select TE oscillation in accordance with the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gain-coupling type distributed feedback semiconductor laser device having a periodically varying gain along a cavity direction, comprising:
    a first periodic undulation formed along the cavity direction, the first periodic undulation including convex and concave portions;
    a semiconductor embedded layer formed on the first periodic undulation; and
    at least one active layer formed within the semiconductor embedded layer so as to extend along a direction which is perpendicular to the surface of a substrate, the at least one active layer being present on the concave portions of the first periodic undulation with a period which is substantially equal to a period of the first periodic undulation.

2. A gain-coupling type distributed feedback semiconductor laser device according to claim 1, wherein the semiconductor embedded layer and the at least one active layer comprise a III–V group compound semiconductor containing at least one III group element and at least one V group element, the semiconductor embedded layer comprising the at least one III group element at a component ratio not equal to a component ratio at which the at least one active layer comprises the at least one III group element.

3. A gain-coupling type distributed feedback semiconductor laser device according to claim 1, wherein the at least one active layer comprises a vertical quantum well structure.

4. A gain-coupling type distributed feedback semiconductor laser device according to claim 1, wherein the at least one active layer is formed of a quantum well wire structure, at least one layer of the quantum well wire structure being provided along a direction which is perpendicular to the surface of the substrate.

5. A gain-coupling type distributed feedback semiconductor laser device according to claim 1, wherein at least two periodic undulations including the first periodic undulation are provided, the at least two periodic undulations comprise convex and concave portions which are formed in a same period and positions as that of the first periodic undulation.

6. A gain-coupling type distributed feedback semiconductor laser device according to claim 5, wherein the at least two periodic undulations have substantially a same shape.

7. A gain-coupling type distributed feedback semiconductor laser device according to claim 1, wherein each of the concave portions of the periodic undulation comprises a flat portion having a width along the cavity direction which is in the range of about 0 nm to about 30 nm.

8. A gain-coupling type distributed feedback semiconductor laser device according to claim 1, wherein each of the concave portions of the periodic undulation comprises lateral surfaces formed of a (n11) plane and a bottom formed of the (100) plane.

9. A gain-coupling type distributed feedback semiconductor laser device according to claim 1, wherein each of the concave portions has a depth equal to or greater than about 40 nm.

10. A gain-coupling type distributed feedback semiconductor laser device according to claim 1, wherein the semiconductor embedded layer comprises a III–V group compound semiconductor containing at least one III group element and at least one V group element, wherein the at least one III group element is selected from Al and Ga.

11. A gain-coupling type distributed feedback semiconductor laser device according to claim 1, wherein the semiconductor embedded layer comprises Al at a component ratio in the range of about 0.1 to about 0.3.

12. A gain-coupling type distributed feedback semiconductor laser device according to claim 5, wherein at least one semiconductor layer is provided between the at least two periodic undulations, the semiconductor layer is formed of a compound semiconductor containing Al at a component ratio which is equal to or greater than about 0.45.

13. A gain-coupling type distributed feedback semiconductor laser device according to claim 1, wherein the at least one active layer has a height which is equal to or greater than about 60 nm.

14. A method for producing a gain-coupling type distributed feedback semiconductor laser device having a periodically varying gain along a cavity direction, comprising the steps of:
    forming a periodic undulation including convex and concave portions on a surface of a semiconductor; and
    forming a semiconductor embedded layer formed on the periodic undulation, the semiconductor embedded layer including periodically disposed active layers.

15. A method for producing a gain-coupling type distributed feedback semiconductor laser device according to claim 14,
    wherein the semiconductor embedded layer comprises a III–V group compound semiconductor containing at least two III group elements having respective migration rates, and
    wherein the step of forming the semiconductor embedded layer comprises forming the active layers so that the active layers comprise one of the at least two III group elements at a component ratio not equal to a component ratio at which the semiconductor embedded layer comprises the one of the at least two III group elements.

* * * * *